United States Patent
O'Brien et al.

(10) Patent No.: US 9,300,326 B2
(45) Date of Patent: Mar. 29, 2016

(54) PREVENTION OF OUTPUT SUPPLY BOOSTING UPON REMOVAL OF INPUT ADAPTER

(71) Applicant: QUALCOMM Incorporated, San Diego, CA (US)

(72) Inventors: Thomas J O'Brien, Powell, OH (US); Christian G Sporck, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 375 days.

(21) Appl. No.: 13/834,460

(22) Filed: Mar. 15, 2013

(65) Prior Publication Data

US 2014/0117944 A1    May 1, 2014

Related U.S. Application Data

(60) Provisional application No. 61/721,381, filed on Nov. 1, 2012.

(51) Int. Cl.
*H02J 7/06* (2006.01)
*H03M 13/11* (2006.01)
*H04B 7/04* (2006.01)
*H04L 1/00* (2006.01)

(52) U.S. Cl.
CPC ......... *H03M 13/1102* (2013.01); *H04B 7/0413* (2013.01); *H04L 1/0041* (2013.01)

(58) Field of Classification Search
CPC ............................... H02J 7/0052; H02J 7/022
USPC ................. 320/133, 134, 157, 158, 159
See application file for complete search history.

(56) References Cited

U.S. PATENT DOCUMENTS

| | | | |
|---|---|---|---|
| 5,250,891 A * | 10/1993 | Glasgow | 320/140 |
| 5,811,895 A * | 9/1998 | Suzuki et al. | 307/125 |
| 7,432,685 B2 | 10/2008 | Hayashi | |
| 8,179,098 B2 | 5/2012 | Kurokawa et al. | |
| RE43,538 E | 7/2012 | Solie et al. | |
| 2002/0131280 A1* | 9/2002 | Balakrishnan | 363/21.15 |
| 2005/0024032 A1* | 2/2005 | Yamamoto | 323/282 |
| 2007/0229022 A1 | 10/2007 | Hanafusa et al. | |
| 2008/0080219 A1 | 4/2008 | Sohma | |
| 2008/0224661 A1 | 9/2008 | Onose | |
| 2008/0267015 A1* | 10/2008 | Zhang et al. | 368/10 |
| 2009/0033289 A1* | 2/2009 | Xing et al. | 320/140 |
| 2010/0060244 A1* | 3/2010 | Kurokawa et al. | 320/166 |
| 2011/0242868 A1* | 10/2011 | Gray et al. | 363/131 |
| 2011/0254508 A1* | 10/2011 | Sakakibara | H01M 10/441 320/118 |
| 2012/0268094 A1* | 10/2012 | Scaldaferri et al. | 323/284 |

FOREIGN PATENT DOCUMENTS

| EP | 2040362 A1 | 3/2009 |
|---|---|---|
| EP | 2071714 A1 | 6/2009 |

OTHER PUBLICATIONS

International Search Report and Written Opinion—PCT/US2013/068071—ISA/EPO—Oct. 21, 2014.

* cited by examiner

*Primary Examiner* — Edward Tso
*Assistant Examiner* — Aaron Piggush
(74) *Attorney, Agent, or Firm* — Fountainhead Law Group P.C.

(57) ABSTRACT

A charging circuit using a switch mode power supply to charge a battery from a connected external power adapter may periodically turn off the switch mode power supply and disconnect its input terminal from the switch mode power supply. A load may be connected to the input terminal. The input terminal is monitored for voltage collapse, indicating whether or not the power adapter is connected.

21 Claims, 7 Drawing Sheets

Basic Buck Converter Circuit

PREVENTION OF OUTPUT SUPPLY BOOSTING UPON REMOVAL OF INPUT ADAPTER

CROSS REFERENCE TO RELATED APPLICATIONS

The present disclosure claims priority to U.S. Provisional App. No. 61/721,381 filed Nov. 1, 2012, the content of which is incorporated herein by reference in its entirety for all purposes.

BACKGROUND

Unless otherwise indicated herein, the approaches described in this section are not prior art to the claims in this application and are not admitted to be prior art by inclusion in this section.

Battery charging circuits that use a switch-mode architecture typically employ a switcher circuit to charge a battery. The term "battery" may refer to a single cell configuration or a multiple cell stack configuration (e.g., a 2S configuration, which comprises 2 series-connected cells).

In some designs, a battery charging circuit that uses a buck type switch-mode architecture can boost the charger output voltage back to the input port when the input power supply is disconnected from the circuit. The battery charging circuit can stay stuck in this undesirable state because it cannot distinguish that the input power supply (e.g., wall adapter) has been removed. This can cause a battery that is that is being charged by the battery charging circuit to eventually discharge upon removal of the input power supply. This undesirable behavior can also violate industry specifications such as the Universal Serial Bus (USB) specification.

Consider, for example, the conventional switch-mode architecture charging circuit shown in FIG. 6A. When a power supply is connected to the circuit, current can flow from the power supply to the battery, thereby charging the battery; and to the load, thereby providing power to the load.

If the duty cycle of the switching circuit reaches very high levels, for example, due to a combination of input voltage collapse (e.g., the adapter cable impedance can cause a large IR-drop) and a nearly fully charged battery, it is possible to cause the charger to incorrectly operate in boost-converter mode after the input adapter is removed. The resulting current flows may set up as shown in FIG. 6B. The primary cause of this "boost-back" behavior is negative inductor current being supplied from the battery during the ON time of the low-side FET. Once this happens, there will be a voltage on the input of the charger that is proportional to the battery voltage and boost-mode duty cycle, resulting in the battery eventually discharging when the adapter is removed. This occurrence of the negative inductor current cannot be completely prevented due to inherent accuracy limitations of zero-crossing detection circuits.

Solutions to this unintended operation include monitoring the adapter input and turning off the switcher when the adapter input goes below some threshold. This method restricts the useful range of an adapter. Some solutions take this a step further, and use software to periodically check the BMS circuitry for negative current flow.

SUMMARY

A charging circuit for delivering power from a power adapter to a battery may comprise a switchable load that can be selectively connected to the input terminal of the charging circuit. A comparator may sense the voltage at the input terminal. The charging circuit may periodically disable the delivery of power from the power adapter to the battery and activate the switchable load for a fixed duration of time. If the comparator senses voltage collapse, then the charging circuit may determine that the power adapter has been disconnected from the charging circuit. If the comparator does not sense voltage collapse, then the charging circuit may resume delivery of power from the power adapter to the battery.

In some embodiments, the charging circuit may repeat the foregoing process on a timed basis. In some embodiments, the timing between iterations may change. In some embodiments, the foregoing may be activated based on the occurrence of one or more conditions, in order to improve efficiency.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
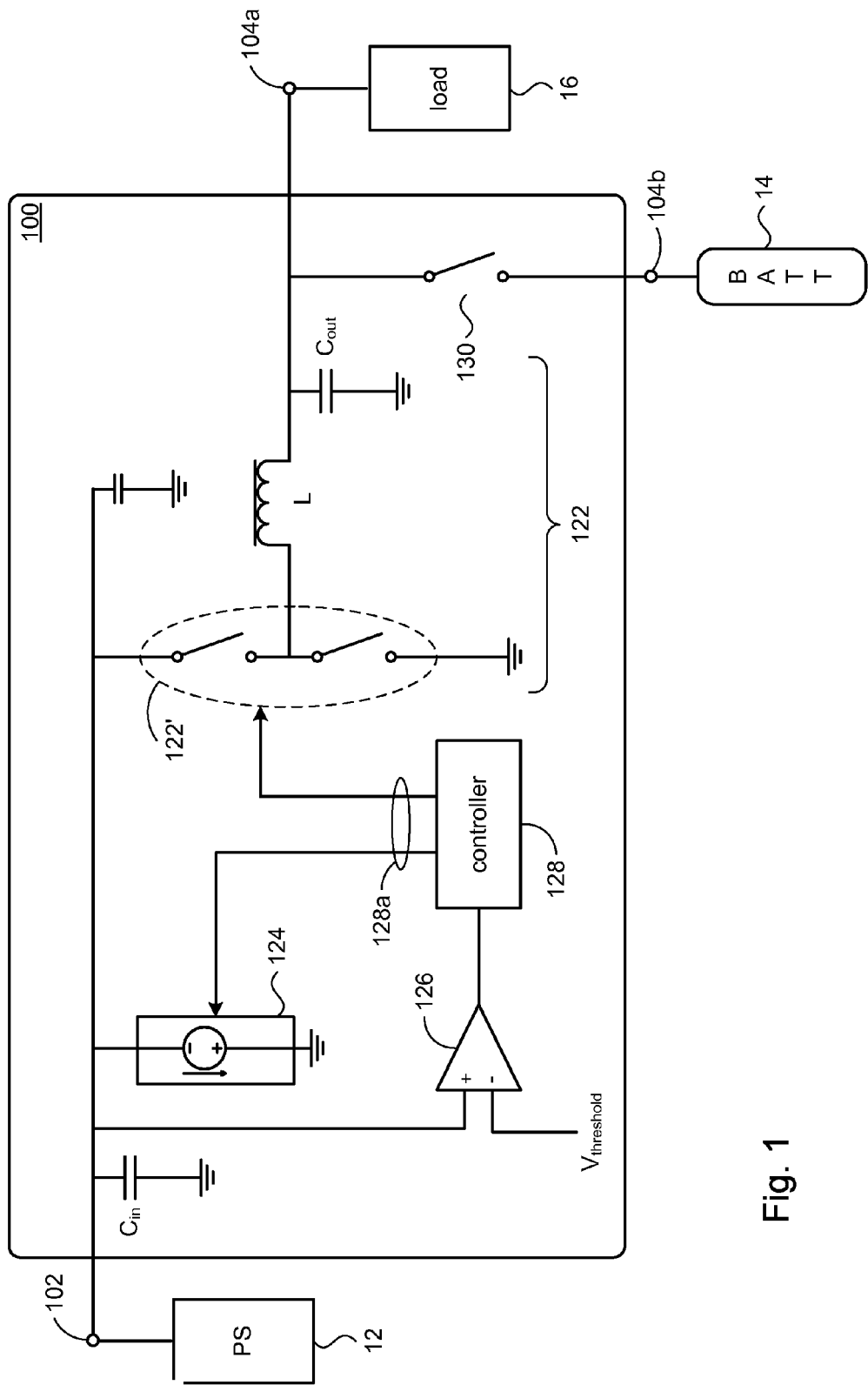
FIG. 1 shows a high level schematic diagram of a charging circuit in accordance with principles of the present disclosure.

In some embodiments, as illustrated in the generalized schematic representation of FIG. 1, a charging circuit 100 in accordance with the present disclosure may comprise an input terminal 102 and output terminals 104a and 104b. The charging circuit 100 may be incorporated in a battery-powered electronic device such as a cellular telephone, a computing device, and so on. The electronics (load 16) comprising the battery-powered electronic device may be connected to output terminal 104a. A rechargeable battery 14 may be connected to output terminal 104b to provide power to the load 16. An external power source 12 (e.g., an AC wall adapter, another electronic device, etc.) may be connected to the input terminal 102 to provide power to charge the battery 14 and/or to provide power to the load 16.

In some embodiments, the charging circuit 100 may comprise a switch-mode power supply 122. For example, in an embodiment, the switch-mode power supply 122 may be a buck converter comprising a switching circuit 122', inductor L, and capacitor $C_{out}$. The switch-mode power supply 122 may deliver power received at the input terminal 102 to recharge the battery 14 and/or to deliver power to the load 16.

The charging circuit may include a switch 130 to disconnect the battery 14 from the charging circuit 100 under certain circumstances, for example, to avoid damaging the battery when charging during an over-temperature or under-temperature condition. In some embodiments, the switch 130 may also be used to regulate charge current.

In accordance with principles of the present disclosure, the charging circuit 100 may further comprise a switchable load 124, a comparator 126, and a controller 128 that controls the switchable load and the switch-mode power supply 122. The switchable load 124 may be selectively connected to the input terminal 102.

The controller 128 may assert control signals 128a to operate the switchable load 124. The control signals 128a may also control operation of the switch-mode power supply 122, in accordance with the present disclosure. In some embodiments, the controller 128 may generate and assert control signals 128a in accordance with the output of comparator 126.

In various embodiments, the switchable load 124 may be implemented using any design that allows the switchable load to be operated or controlled by the controller 128. In particular, the switchable load 124 may selectively provide an electrical connection between the input terminal 102 and ground potential.

Figure 2:
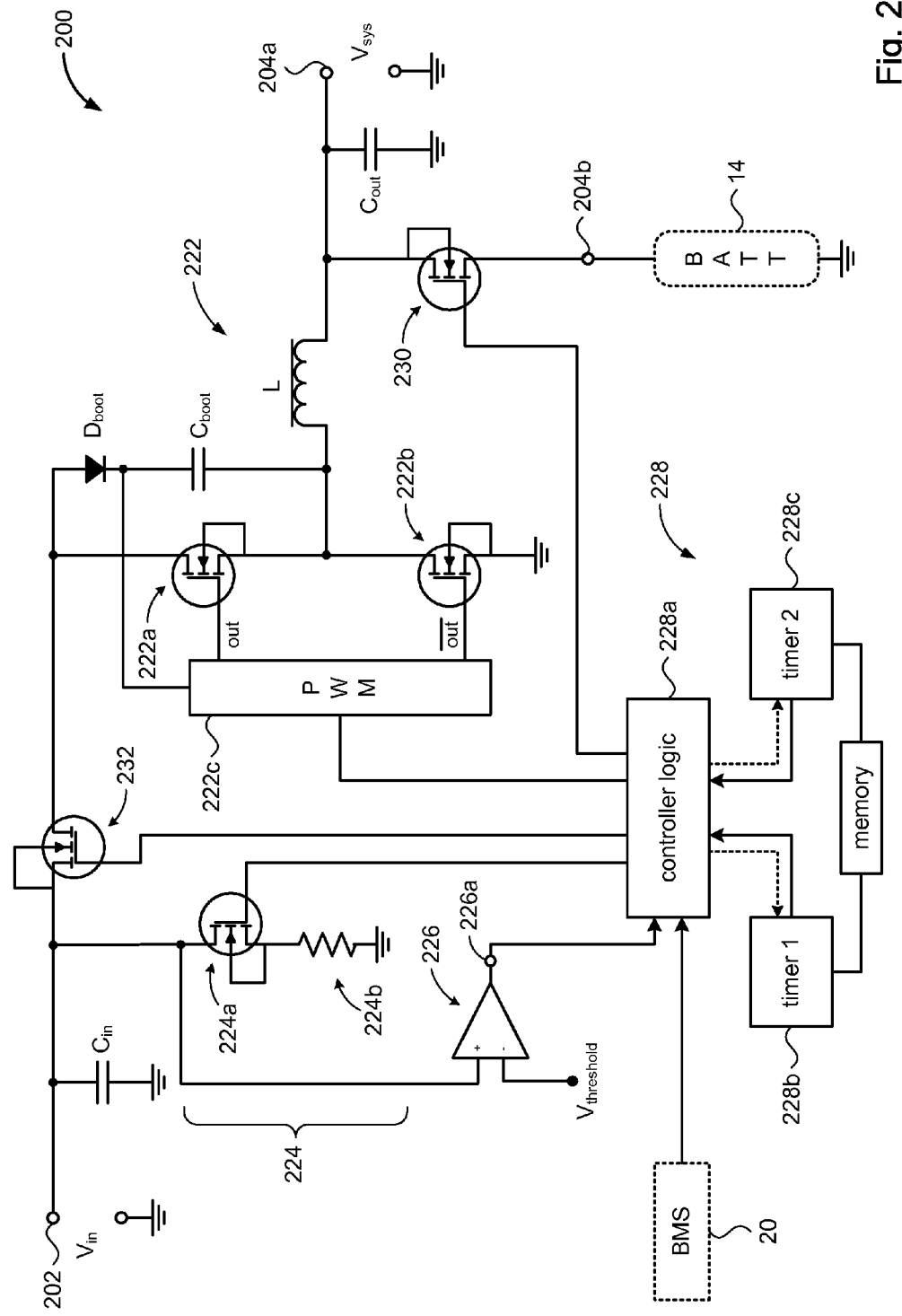
FIG. 2 shows an illustrative embodiment of a charging circuit.
Figure 5:
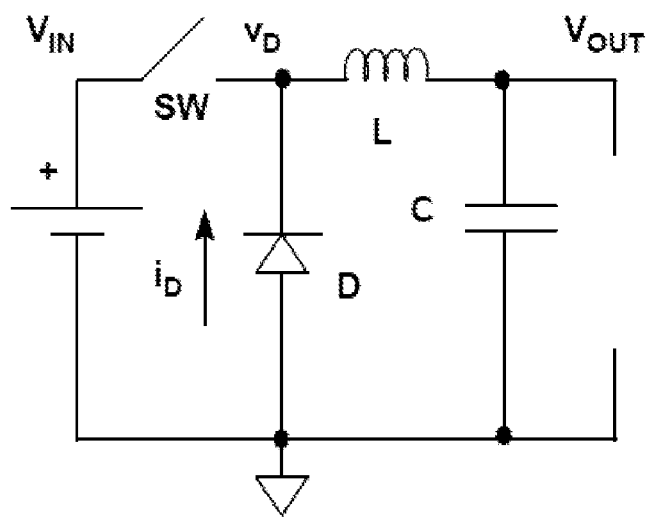
FIG. 5 shows a conventional buck converter design.

Referring to FIG. 2, an illustrative embodiment of a charging circuit 200 in accordance with principles of the present disclosure includes input terminal 202 and output terminals 204a, 204b. In some embodiments, a design known as a buck converter may serve as the switch-mode power supply 222. The basic design of a typical buck converter is shown in FIG. 5. The buck converter 222 shown in FIG. 2 may include an inductor L and capacitor $C_{out}$, which respectively correspond to the inductive element (L) and capacitive element (C) shown in FIG. 5. The buck converter 222 may further include field effect transistors (FETs) 222a and 222b, driven by pulses from a pulse width modulated (PWM) signal generator 222c. The FETs 222a, 222b are driven by respective pulses out and $\overline{out}$ and function respectively as the switch element (SW) and diode element (D) shown in FIG. 5.

The PWM signal generator 222c may include drivers (not shown) to drive the gate potential $V_{gs}$ of the FETs 222a, 222b. In the particular embodiment shown in FIG. 2, the FETs 222a and 222b are N-type devices (NFETs). The high-side FET 222a references its output to a floating voltage, namely the voltage at its connection to inductor L. Accordingly, the driver (not shown) for FET 222a may use a boot-strap circuit (e.g., $D_{boot}$ and $C_{boot}$) in order to drive the gate potential ($V_{gs}$) of high-side FET 222a higher than the source to maintain $V_{gs} > V_{th}$ in order that the FET can turn ON.

In a particular embodiment, the switchable load 224 may comprise an FET switch 224a connected in series with a resistive element 224b. It will be appreciated of course, that the switchable load 224 may comprise any suitable design, for example, an op-amp current sink that can be enabled and disabled. The gate of FET 224a may be controlled by controller logic 228a. Comparator 226 may compare the voltage across resistive load 224b with a threshold voltage $V_{threshold}$. The output 226a may serve as an input signal to the controller logic 228a.

The controller 228 may comprise controller logic 228a and timers 228b and 228c. In addition to controlling the switchable load 224, the controller logic 228a may control operation of the PWM signal generator 222c. In accordance with principles of the present disclosure, the controller logic 228a may disable operation of the PWM signal generator 222c. An input FET 232 may be used to provide reverse blocking from the battery 14 when the buck converter 222 is disabled; otherwise, the high-side body diode of FET 222a will allow the battery voltage to appear on the input terminal 202 if input FET 232 is not present.

The controller logic 228a may initiate the timers 228b, 228c and reset the timers. The timers 228a, 228b may be programmed with predetermined timer values that may be stored in a non-volatile memory. The non-volatile memory may be programmable.

In some embodiments, an electronic device (not shown) that incorporates the battery charging circuit 200 may include a battery management system (BMS) 20. As the name implies, the BMS 20 performs various functions to manage the output, charging, and discharging of the battery (or battery pack) in a device. The BMS 20 may monitor voltage, current, and temperature to provide various notifications on the status of the battery, such as state of charge (SOC), state of health (SOH), and so on. As mentioned below, the BMS 20 may provide the controller logic 228a with certain information about the state of operation of the battery.

Figure 3:
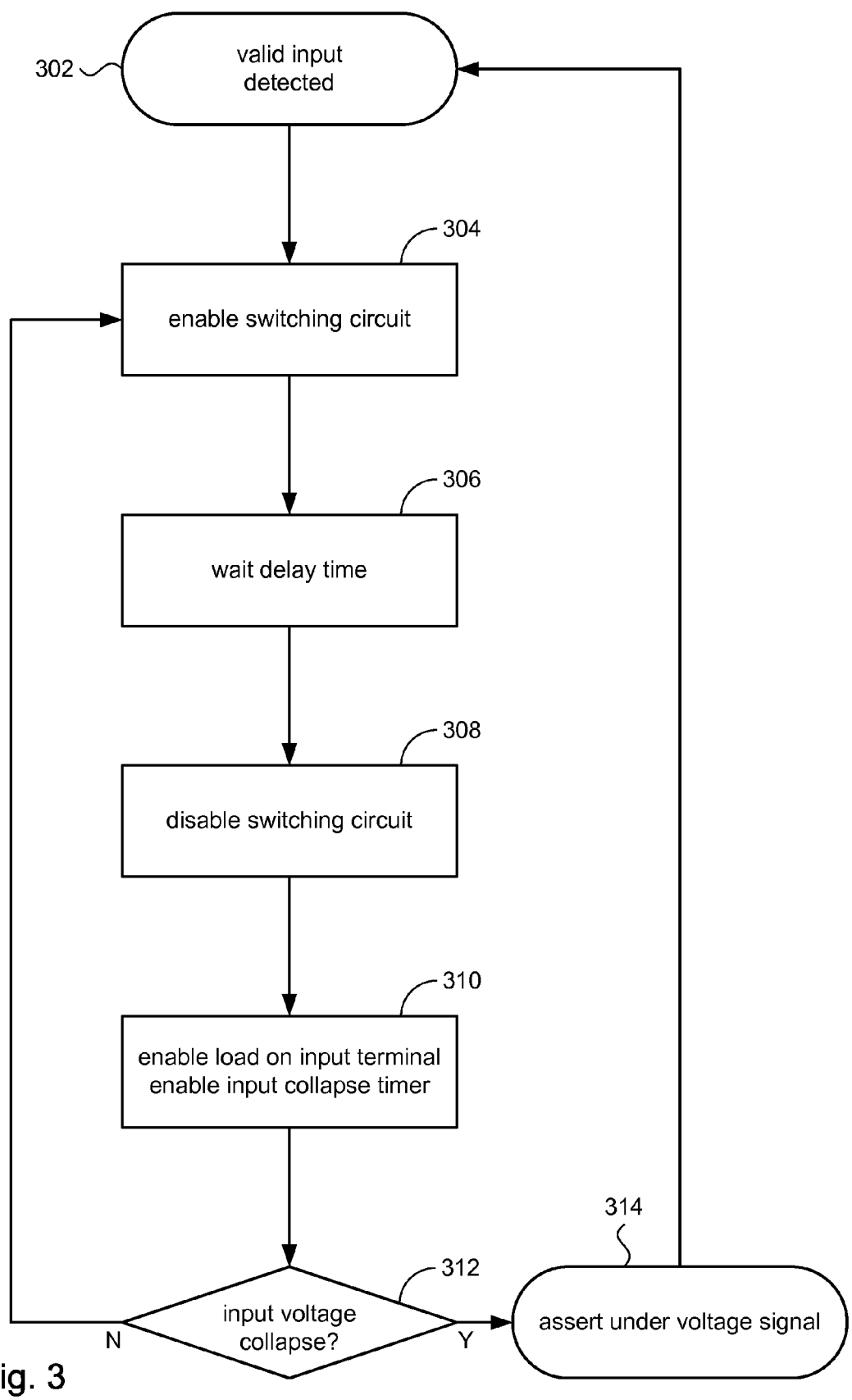
FIG. 3 illustrates processing of a charging circuit according to the present disclosure.

Referring to FIG. 3, operation of the charging circuit 200 shown in FIG. 2 in accordance with aspects of the present disclosure will now be discussed. At block 302, when a power supply is connected to the charging circuit 200, the charging circuit may detect the voltage provided by the power supply as a valid input to the circuit, which may constitute a connection event. At block 304, the charging circuit 200 may enable operation of the buck converter 222 in response to the connection event. For example, the controller logic 228a may assert an enable signal, which the PWM signal generator 222c may respond to by outputting out and $\overline{out}$.

In accordance with principles of the present disclosure, in some embodiments, the charging circuit 200 may initiate timer (delay timer) 228b to count down a predetermined amount of time, at block 306. When the delay timer 228b times out in block 306, then at block 308 the charging circuit 200 may disable the buck converter 222, for example, by ceasing operation of the PWM signal generator 222c.

At block 310, the charging circuit 200 may enable the switchable load 224 on the input terminal 202. At the same time, the charging circuit 200 may initiate timer (input collapse timer) 228c to count down a predetermined amount of time. In addition, the charging circuit 200 may turn OFF the input FET 232 in order to electrically disconnect or otherwise electrically isolate the input terminal 202 from the buck converter 222.

At block 312, during the running of the input collapse timer 228c, if the input voltage $V_{in}$ falls below an under-voltage threshold level, then an under-voltage condition may be signaled at block 314. The charging circuit 200 may determine that the power supply is disconnected. The controller logic 228a may respond to the under-voltage condition by maintaining the buck converter 222 in the disabled state, and thus avoid the possibility of boost-back operation. Processing in the charging circuit 200 may return to block 302 to wait for another connection event.

If at block 312, the input voltage $V_{in}$ does not reach an under-voltage condition when the input collapse timer 228c runs out, then the charging circuit 200 may determine that the power supply remains connected. The controller logic 228a may turn ON the input FET 232 and processing in the charging circuit 200 may return to block 304, where the controller logic may re-enable the buck converter 222 and the loop 304-312 may be repeated.

Returning to block 312, if the power supply is disconnected from charging circuit 200, then $V_{in}$ will be supplied only by the charge that remains on the input capacitor $C_{in}$ during the time that the input collapse timer 228c is running Consequently, $V_{in}$ will collapse very quickly to the under-voltage condition by virtue of the connection of the input terminal 202 being connected to the switchable load 224. The timing for the input collapse timer 228c may be selected to allow sufficient time for the input capacitor $C_{in}$ to be discharged.

If, on the other hand, the power supply is connected to the charging circuit 200, then voltage collapse of $V_{in}$ will not occur so long as the resistive load 224b is sufficiently small that the power supply can drive the resistive load. For example, the resistive load 224a may be designed to draw a low amount of current, say 10 mA, which is likely to be well within the capability of the power supply.

During the time that the buck converter 222 is disabled at block 312, the battery 14 is supplying power to the system load 16. Accordingly, in a practical system, it may be desirable to keep the timing value for the input collapse timer 228c to a minimum in order to minimize the amount of time that the buck converter 222 is disabled and the battery 14 is the sole source of power, but long enough for the input capacitor $C_{in}$ to discharge below the under-voltage threshold level when the power supply is disconnected. For example, in some embodiments, the timing value for the input collapse timer 228c may be on the order of milliseconds, but may be different in other embodiments.

Another practical consideration is to adjust the timing value for the delay timer 228b so that the loop 304-312 is not repeated too frequently. In some embodiments, for example, the delay timer 228b may provide a 30 ms delay, while in other embodiments, the delay timer may delay for a different amount of time. In some embodiments, the timing values for timers 228b and 228c may be preprogrammed in memory. In other embodiments, the timing values may be adjusted with subsequent iterations of the loop 304-312.

Figure 4:
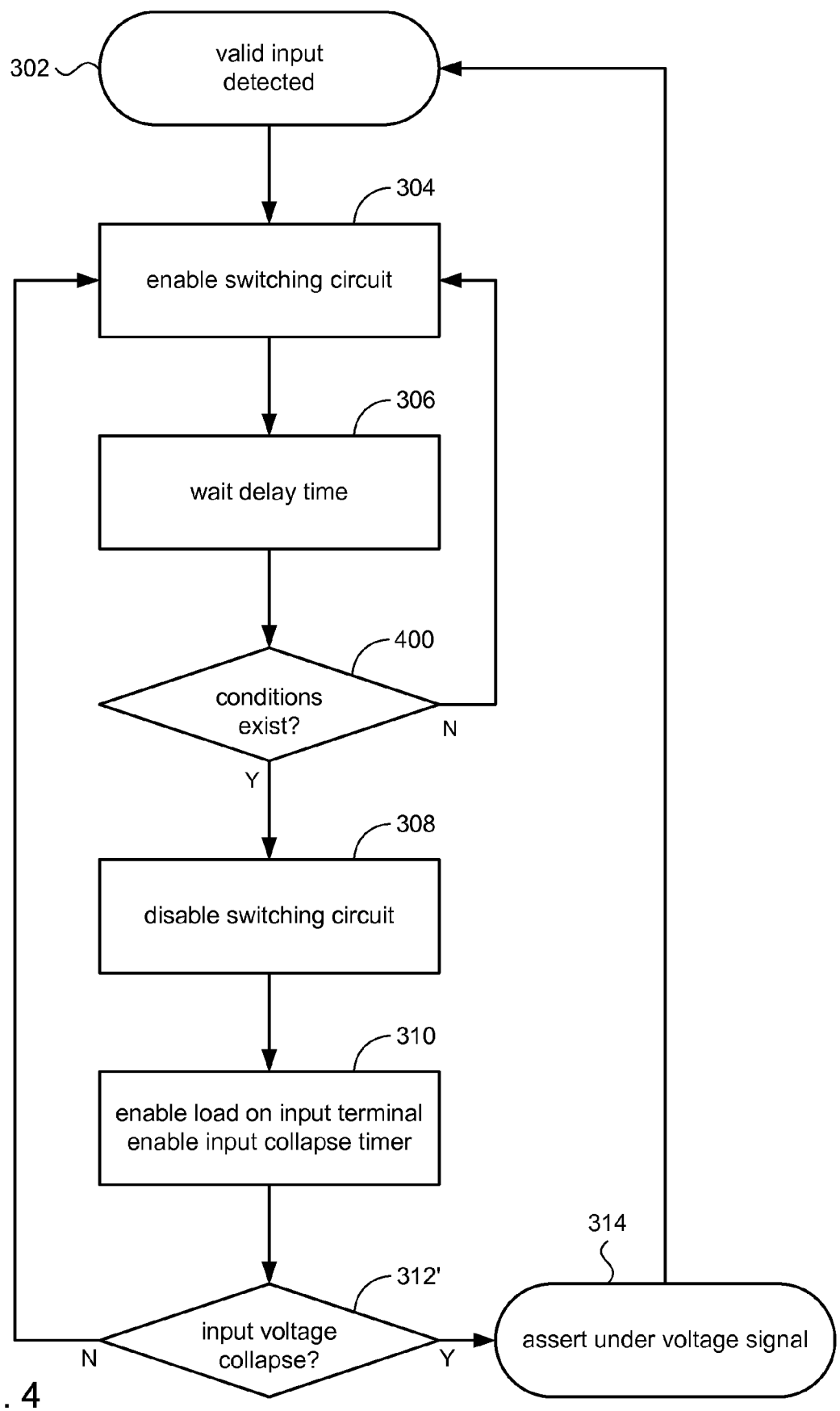
FIG. 4 illustrates an example of alternative processing of a charging circuit according to the present disclosure.

In some embodiments, the charging circuit 200 may test for the occurrence of certain conditions before activating the loop 304-312. Referring to FIG. 4, processing of the charging circuit 200 in accordance with some embodiments of the present disclosure may include blocks 302, 304, and 306, which proceed as explained in connection with respective blocks 302, 304, and 306 in FIG. 3. In block 306, after the delay timer 228b times out, the charging circuit 200 may test for the occurrence of certain condition(s) at block 400. If the condition(s) do not exist, then processing returns to block 304 and the loop 304-312 may be repeated. Otherwise, processing proceeds to block 308.

The conditions may be indicated by signals relating to the state of battery operation. In some embodiments, for example, the BMS 20 and/or the controller logic 228a may provide signals indicative of various states of battery operation that may be used to indicate the possibility of a boost-back scenario. For example, the following conditions may be provided by the BMS 20 and/or the controller logic 228a and tested for at block 400:

battery charging is enabled AND
    the PWM signal generator 222a is operating at maximum duty cycle AND
    a current-termination level in the charging current has been reached.

Figure 6A:
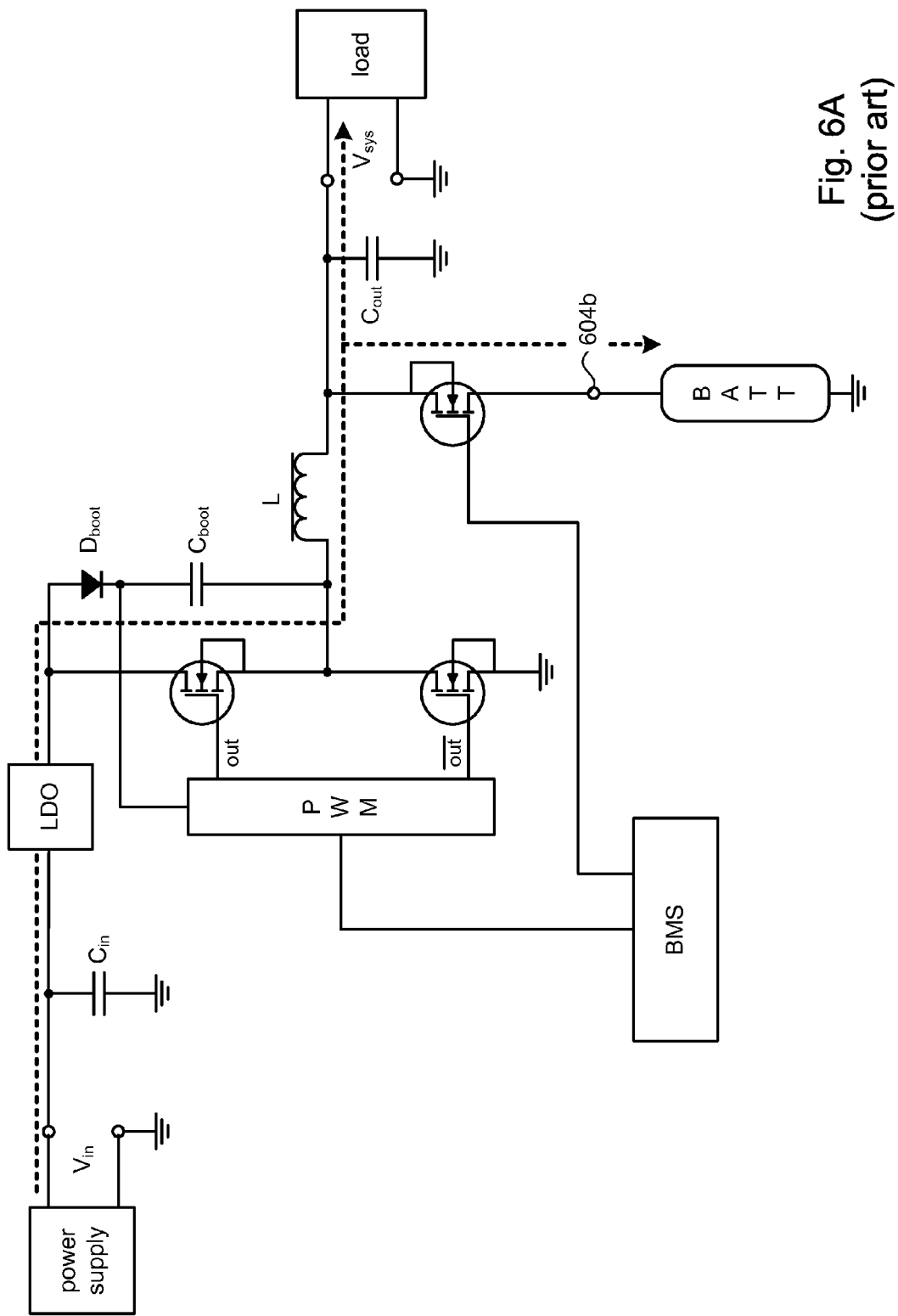
FIG. 6A illustrates current flows in a conventional buck charging circuit.
Figure 6B:
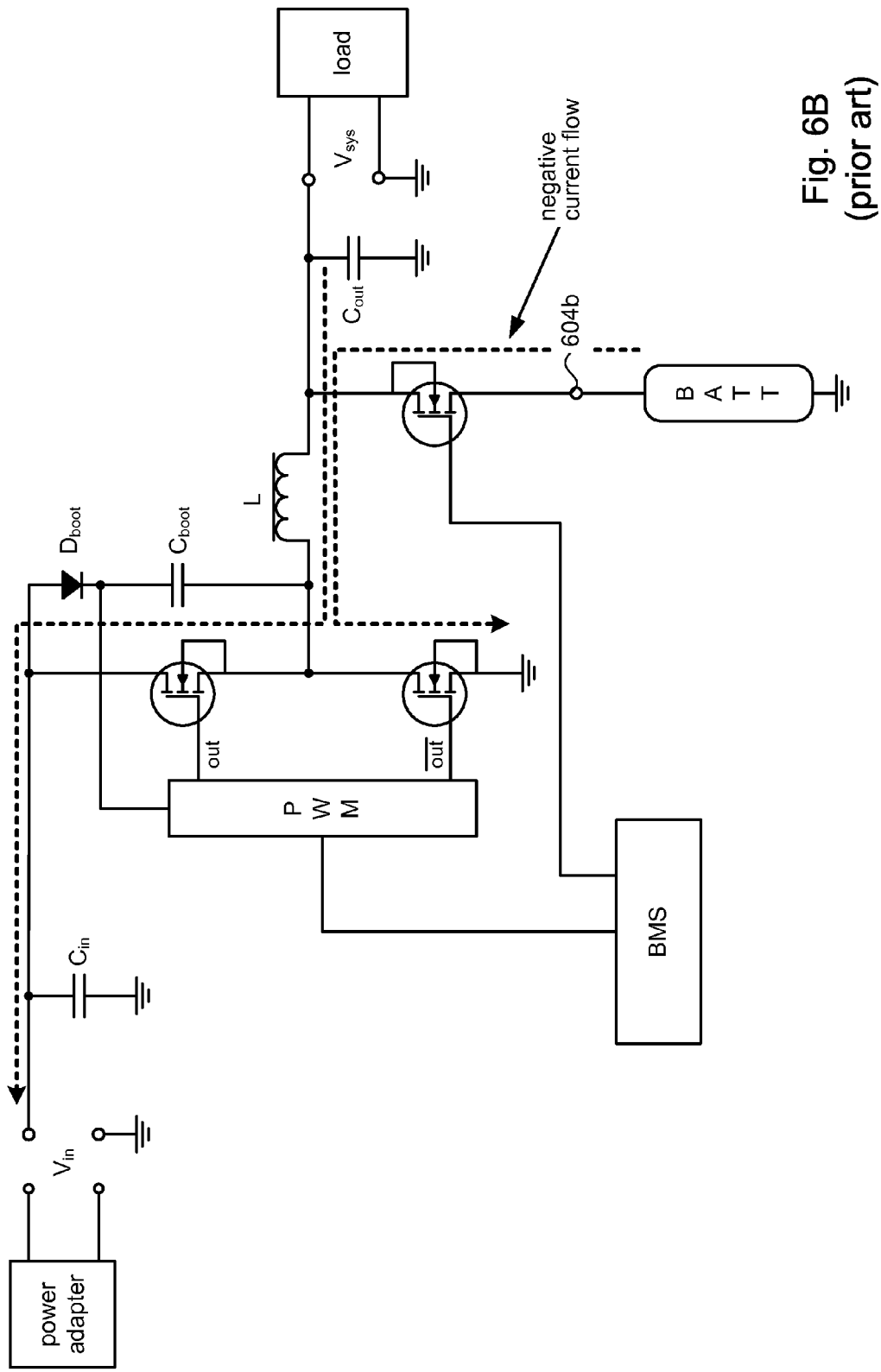
FIG. 6B illustrates an example of boost-back operation in a conventional buck charging circuit.

Under these conditions, if the battery is being charged, then boost-back can occur if the power supply is removed and the charge current goes below the termination level and then becomes negative current, as illustrated in FIG. 6B. In other words, the battery 14 is sourcing current. As the input voltage collapses, the buck-mode duty cycle will increase. Once the duty cycle hits a maximum, that condition will be latched momentarily. When both of these conditions are true during charging, there is the possibility of boost-back operation.

As another example, block 400 may test for the following conditions:

battery charging is disabled AND
    the PWM signal generator 222a is operating at maximum duty cycle AND
    the battery is present.

Unlike the foregoing conditions, when charging is disabled there is no way to tell if the battery is providing positive current to the system, or if the part is boosting-back. Accordingly, when the PWM signal generator 222a is operating at its maximum duty cycle, the loop 304-312 may be performed on a repeating basis as described in FIG. 3. However, in order to avoid disruptions in system power, the loop 304-312 may be conditionally performed only if the battery is determined to be present.

In other embodiments, still other conditions may be tested for in block 400. If a condition is present, then the charging circuit 200 may proceed with blocks 308 and 310 as discussed above. At block 312', if input voltage collapse is not detected, then the loop 304-312 may be repeated as discussed above. However, the timing values for timers 228b and 228c may be adjusted in block 312' in order to minimize the amount of time that the buck converter 222 is disabled. For example, in some embodiments, the delay timer 228b may provide a 30 ms delay for the first three iterations of loop 304-312, and on the fourth loop the delay timer may provide a 1 S delay. The cycle may then be repeated. It will be appreciated, of course, that this is merely an example and that the delay timer 228b may be adjusted according to any suitable schedule.

The above description illustrates various embodiments of the present invention along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What we claim is:

1. A method in a charging circuit comprising:
detecting a voltage from a power supply at an input terminal of the charging circuit;
in response to the detecting, enabling a switching circuit for a first predetermined duration of time to provide power to an output terminal of the charging circuit;
on expiration of the first predetermined duration of time, disabling the switching circuit and connecting a load to the input terminal for a second predetermined duration of time; and
on expiration of the second predetermined duration of time, disconnecting the load and enabling the switching circuit if a voltage level at the input terminal exceeds a predetermined value.

2. The method of claim 1 wherein connecting the load to the input terminal includes disconnecting the input terminal from the switching circuit.

3. The method of claim 1 further comprising ascertaining occurrence of one or more predefined conditions and, in response thereto, disabling the switching circuit for the first duration of time.

4. The method of claim 3 further comprising delaying for a predetermined amount of time prior to occurrence of one or more predefined conditions.

5. The method of claim 1 further comprising starting a first timer to establish the first predetermined duration of time and starting a second timer to establish the second predetermined duration of time.

6. The method of claim 1 further comprising receiving power from an external device connected to the input terminal.

7. The method of claim 1 further comprising charging a battery connected to the output terminal using the power received at the input terminal.

8. A charging circuit comprising:
an input terminal for connecting to an external device;
an output terminal for connection to a battery;
a switching circuit connected between the input terminal and the output terminal;
a switchable load connected to the input terminal; and
a controller configured to selectively enable and disable the switching circuit, and to selectively operate the switchable load,
wherein the controller is further configured to:
enable the switching circuit for a first predetermined duration of time in response to detection of a voltage from a power supply at the input terminal; and
on expiration of the first predetermined duration of time, disable the switching circuit and connect the switchable load to the input terminal for a second predetermined duration of time; and
on expiration of the second predetermined duration of time, disconnecting the load and enabling the switching circuit if a voltage level at the input terminal exceeds a predetermined value.

9. The circuit of claim 8 further comprising a switch connected between the input terminal and the switching circuit, wherein the switch is opened when the switchable load is in the connected state thereby disconnecting the input terminal from the switching circuit.

10. The circuit of claim 8 wherein the switchable load comprises a switch in series-connection with an electronic device.

11. The circuit of claim 10 wherein the electronic device is a resistor.

12. The circuit of claim 10 wherein the electronic device is a current sink.

13. The circuit of claim 8 wherein the switching circuit comprises a buck converter.

14. The circuit of claim 8 wherein the controller disables the switching circuit when a one or more predetermined conditions have occurred after the controller enables the switching circuit.

15. The circuit of claim 8 further comprising a first timer configured to provide the first predetermined duration of time and a second timer configured to provide the second predetermined duration of time.

16. A method in a battery charging circuit comprising:
enabling operation of a switching circuit, in response to detection of a voltage from an external power supply connected to an input of the battery charging circuit, to deliver power from the external power supply to a battery connected to an output of the switching circuit, the switching circuit enabled for a first predetermined period of time;
after the first predetermined period of time has passed:
disabling operation of the switching circuit; and
grounding the input of the battery charging circuit via a load for a second predetermined period of time;
if a voltage at the input of the battery charging circuit falls below a predetermined value during the second predetermined period of time, then maintaining disabled operation of the switching circuit; and
if a voltage at the input of the battery charging circuit does not fall below the predetermined value during the second predetermined period of time, then re-enabling operation of the switching circuit.

17. The method of claim 16 wherein grounding the input of the battery charging circuit includes electrically isolating the input from the switching circuit.

18. The method of claim 16 wherein the switching circuit comprises a buck converter.

19. The method of claim 16 wherein the disabling and grounding are performed only if a predetermined circuit condition is met.

20. The method of claim 16 obtaining a first timer value from a memory and initiating a first timer circuit as a basis for the first predetermined period of time.

21. The method of claim 20 obtaining a second timer value from the memory and initiating a second timer circuit as a basis for the second predetermined period of time.

* * * * *